United States Patent
Niemann et al.

(10) Patent No.: US 6,383,902 B1
(45) Date of Patent: May 7, 2002

(54) METHOD FOR PRODUCING A MICROELECTRONIC SEMICONDUCTOR COMPONENT

(75) Inventors: Ekkehard Niemann, Hanau; Dieter Panknin, Dresden; Wolfgang Skorupa, Weixdorf; Hans Wirth, Dresden, all of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/623,045

(22) PCT Filed: Dec. 19, 1998

(86) PCT No.: PCT/EP98/08339

§ 371 Date: Mar. 13, 2001

§ 102(e) Date: Mar. 13, 2001

(87) PCT Pub. No.: WO99/44225

PCT Pub. Date: Sep. 2, 1999

(30) Foreign Application Priority Data

Feb. 27, 1998 (DE) .......................................... 198 08 246

(51) Int. Cl.$^7$ .......................................... H01L 21/265
(52) U.S. Cl. ....................................................... 438/522
(58) Field of Search .................................... 438/522, 530, 438/559, 795, 796, 797, 909, 931, 943

(56) References Cited

U.S. PATENT DOCUMENTS

| | | |
|---|---|---|
| 4,504,323 A | 3/1985 | Arai et al. |
| 4,571,486 A | 2/1986 | Arai et al. |
| 6,111,260 A | * 8/2000 | Dawson et al. |

FOREIGN PATENT DOCUMENTS

| | | |
|---|---|---|
| DE | 31 39711 A1 | 5/1982 |
| EP | 399 662 A2 | 4/1990 |
| GB | 2 083 010 A | 3/1982 |
| WO | WO 97 39477 A | 10/1997 |

OTHER PUBLICATIONS

Tews, H. et al., "Mg implant activation and diffusion in GaAs during rapid thermal annealing in arsine ambient", J. Appl. Phys. 67 (6) pp. 2857–2861, Mar. 1990.*

Rao, M.V. Gardner, J.A.: Phosphorous and Boron Implantation in 6H–Sic; in: J.Appl. Phys. 81 (10), 1997, pp. 6635–6641.

Sedgwick, T.O.: Short Time Annealing; in: J. Electrochem-.Soc.: Solid–State Science and Technlogy, vol. 190, No. 2, 1983, pp. 484–493.

Conway, K.L., Opyd, W.G., Greiner, M.E., Gibbons, J.F. Sigmon, T.W.: Thermal Pulse Annealing of Boron–Implanted HgCdTe; in: Appl. Phys. Lett. 41 (8), 1982, pp. 77–752.

Ahmed, S., Barbero, C.J., Sigmon, T.W.: Activation of ion implanted dopants in α–Sic; In Appl. Phys. Lett. (6), 1985, pp. 712–714.

* cited by examiner

Primary Examiner—Keith Christianson
(74) Attorney, Agent, or Firm—Venable; Norman N. Kunitz

(57) ABSTRACT

The invention relates to a method for producing a microelectronic semiconductor component, especially made of silicon carbide. According to said method doped areas are produced in the semiconductor by ion implantation and radiation damage in the semiconductor is then eliminated by irradiation with electromagnetic rays. The semiconductor is exposed across substantially its entire surface to pulse-like optical radiation and heated at least in the doped area.

14 Claims, 2 Drawing Sheets

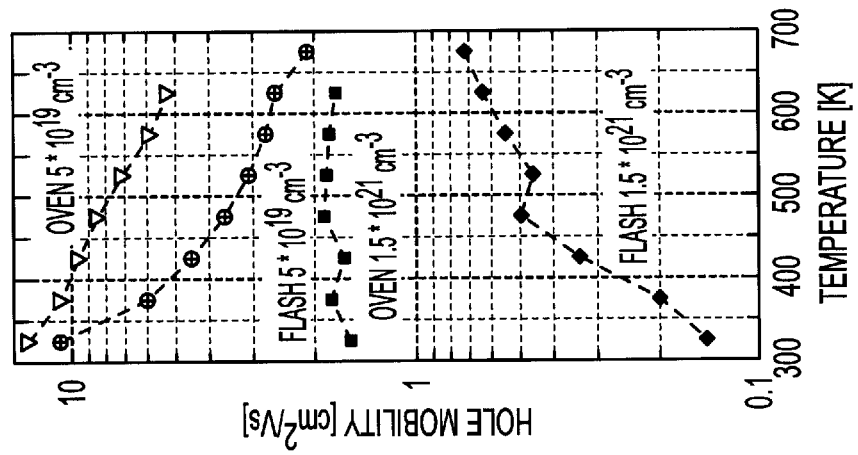
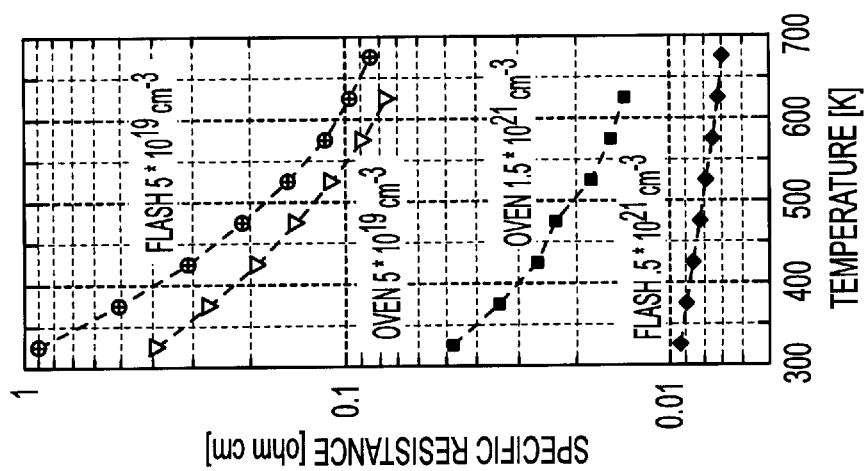
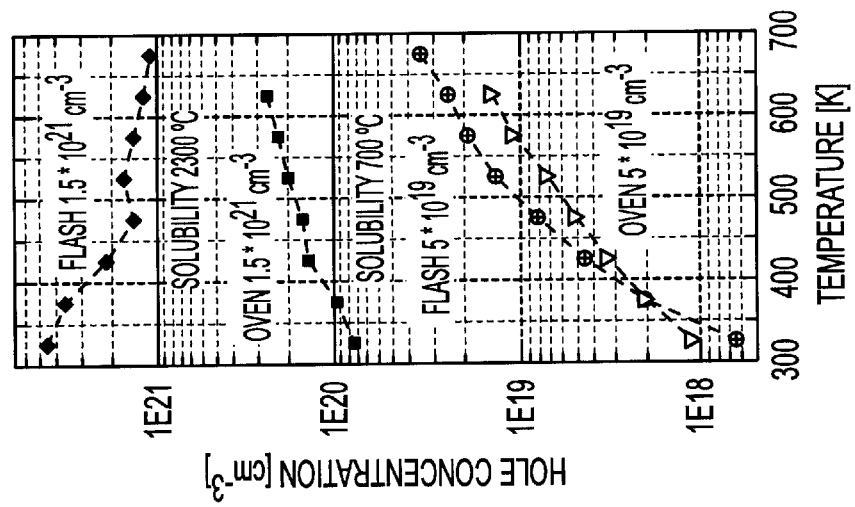

METHOD FOR PRODUCING A MICROELECTRONIC SEMICONDUCTOR COMPONENT

BACKGROUND OF THE INVENTION

The invention relates to a method for producing a microelectronic semiconductor component, in particular made of silicon carbide, wherein doped regions in the semiconductor are produced through ion implantation and irradiation damages in the semiconductor are subsequently annealed through irradiation with electromagnetic rays.

Following the implantation of dopants during the production of microelectronic semiconductor components, the semiconductor shows radiation damage in the region of the implanted volume, in the form of lattice defects and interstitial atoms. The semiconductor must be annealed at a high temperature to improve the crystalline order of the semiconductor once more and electrically activate the implanted dopants. The effect of high temperatures leads to considerable diffusion processes in the semiconductor, which is desirable in the case of doped areas and for annealing the radiation damage caused by the implantation. However, the mobility of all constituents of the semiconductor is strongly increased at high temperatures, so that undesirable diffusions of other components occur as well. Another problem is the possible loss of constituents with high partial pressures during the annealing temperatures, which has disadvantageous effects on electrical or other properties of the semiconductor. In particular semiconductors such as GaAs or SiC show a loss of constituents if increased temperatures effect the component.

It was previously suggested in an article by S. Ahmed et al., in the magazine Applied Physics Letters, Volume 66, Year 1995, page 71 and following, that silicon carbide be heated on the surface with a high-energy excimer laser. A laser beam with high energy and high intensity is guided over a silicon carbide element, whereby the surface is scanned. The disadvantage of this method is that it takes relatively long for the heating, particularly during the annealing of complete semiconductor wafers, and that the energy source for the irradiation is additionally very involved and expensive. Using an excimer laser for the production is particularly problematic since it is not suitable for continuous user and requires extremely expensive filling gases for its operation.

The object of the invention is to provide a simple, quick and inexpensive method for producing a microelectronic component from a semiconductor material, particularly silicon carbide. The method is designed to make possible a far-reaching annealing of the lattice defects and a high degree of dopant activation, without having to heat the complete semiconductor component volume to temperatures exceeding 1000° C. in an oven-type environment.

SUMMARY OF THE INVENTION

The above object is solved accuracy to the present invention by a method for producing a microelectronic semiconductor component, in particular made of silicon carbide, wherein doped regions in the semiconductor are produced through ion implantation and irradiation damages in the semiconductor are subsequently annealed through irradiation with electromagnetic rays, and wherein essentially the complete surface of the semiconductor is irradiated with optical rays and is heated at least in the doped region, and wherein each location on the surface, which is subjected to irradiation, is irradiated at the same time. Modifications and advantageous embodiments follow from the description.

The invention involves using optical rays for irradiating substantially the entire surface of the semiconductor and to anneal this surface at least in the doped area, wherein each location on the surface that is subjected to the rays is irradiated simultaneously. It is particularly favorable if a wavelength or a wavelength range is selected in this case, for which the semiconductor has an increased absorption capacity for the respective rays.

Suitable radiation sources are noble gas high-pressure lamps or metal vapor high-pressure lamps. A particularly suitable radiation source is a xenon high-pressure lamp, especially a Xe photoflash lamp. Favorable pulse lengths are in the range of milliseconds to seconds. The particular advantage here is that the surface region of the semiconductor that must be annealed can be annealed in a single step, in particular with a single light pulse.

With one preferred embodiment, an ion-implanted semiconductor material is irradiated in a protective gas atmosphere, particularly an argon-containing atmosphere. However, an ion-implanted semiconductor material can also be irradiated in a vacuum atmosphere. With this, an undesirable oxidation and/or contamination of the heated semiconductor material is advantageously avoided. In another preferred embodiment of the method according to the invention, ion-implanted semiconductor material is irradiated in an atmosphere with increased partial pressure for one or several volatile components of the semiconductor material, relative to the environmental conditions. This provides protection against degradation of the semiconductor characteristics due to loss of material or due to decomposition of the material.

The method is particularly suitable for semiconductors with increased absorption capacity for electromagnetic rays in a region following an ion-implantation, particularly silicon carbide, whereas the undisturbed semiconductor material does not exhibit an increased absorption in this region. In that case, non-implanted and thus non-disturbed areas of the semiconductor are not heated as strongly as the implanted regions, which are to be annealed. If the absorption capacity in an implanted region does not differ or differs only slightly from the absorption capacity in the undisturbed region, it is advantageous if the undisturbed region is covered, so as to limit the effect of heat to the desired, implanted region.

In one preferred embodiment, a semiconductor material is inserted into a radiation chamber, following an ion-implantation, and is irradiated there with light.

The semiconductor material of one preferred embodiment is treated with ion-implantation at an increased substrate temperature between the room temperature and 1200° C., preferably at about 800° C. and especially preferred at about 400° C. Immediately thereafter, the material is irradiated with light at the same temperature or nearly the implantation temperature and in the same radiation chamber.

The invention is explained with the aid of the exemplary embodiments shown in the Figures.

BRIEF DESCRIPTION OF THE FIGURES

FIG. 1 is a comparison of electrical material parameters for silicon carbide, treated according to prior art and according to the invention with a first doping type.

DESCRIPTION OF THE PREFERRED EMBODIMENTS

Figure 2A:
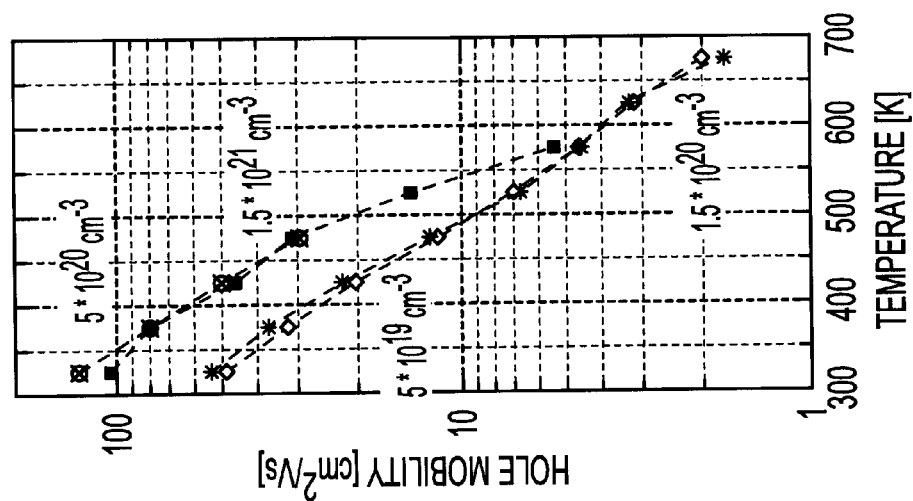
FIG. 2 is a comparison of electrical material parameters of silicon carbide treated according to prior art and according to the invention with a second doping type.

The invention is essentially described in the following with the aid of silicon carbide (SiC) as semiconductor material. However, the invention can also be used for other semiconductor materials, such as other mixed crystals, silicon or other materials, and is not limited to silicon carbide.

In order to realize a desired type of conductance in a semiconductor material, it is necessary to anneal a semiconductor following an ion-implantation of dopants. In the process, the defects resulting from implantation in the crystal lettuce of the semiconductor material are annealed and the dopants travel to electrically active lattice locations. The optimum values that can be reached for the electrical characteristics following the annealing, such as specific resistance or charge carrier concentration, depend on the amount of dopants introduced during the implantation. The maximum solubility of the dopants in the semiconductor material and the diffusion constant of the dopants play an important role for the annealing temperature. If the highest possible charge carrier concentrations and a low specific resistance are to be achieved, it makes sense to implant a dopant concentration, which is still soluble at a predetermined annealing temperature. An considerable surplus of dopants on the other hand does not result in a further improvement of the desired electrical characteristics. In the most unfavorable case, it can actually make things worse since the excessive dopants represent at the very least additional scattering centers in the crystal lattice of the semiconductor.

High temperatures are required for annealing the semiconductor material. For this, a semiconductor material such as silicon carbide is tempered at temperatures between 1500° C. to about 1800° C. in an oven. Normally, the temperature treatment is carried out in a protective gas atmosphere to prevent oxidation of the semiconductor material. Typical annealing times range from 5 to 30 minutes.

The solubility limit of dopants is on the one hand different for different dopant types and, on the other hand, depends on the temperature used for annealing the radiation damage. In most cases, the solubility limits also differ for different poly types of a semiconductor material. With the silicon carbide, the solubility limits for SiC poly types are approximately the same. For aluminum, the solubility for SiC is about $1 \cdot 10^{20}$ cm$^{-3}$ at 1700° C. and approximately $1 \cdot 10^{21}$ cm$^{-3}$ at 2300° C.

A preferred semiconductor component comprises an epitaxial silicon carbide layer of the 6H poly type, which is deposited on a substrate of 6H SiC. Another preferred semiconductor component has an epitaxial silicon carbide layer of about 4H poly type that is deposited on a substrate of 4H SiC. Yet another preferred semiconductor component has a hetero-epitaxial silicon carbide layer of the 3C poly type. Mono-crystalline silicon or a SiC mono-crystal of the 4H or 6H poly type is suitable as a substrate. A favorable layer of thickness is between 0.1 $\mu$m and 50 $\mu$m. With another preferred component, a SiC substrate, particularly of the 4H or 6H poly type, is used directly without an additional SiC layer. Mono-crystalline silicon carbide, which is not doped or highly compensated, particularly semi-insulating, is optically for the most part transparent.

Dopants are subsequently introduced into the SiC material through ion-implantation, preferably aluminum or boron (Bor) for p-conducting material or nitrogen or phosphor for n-conducting material. The implantation takes place in a preferred temperature range between the room temperature and 1100° C. One favorable implantation temperature is near 300° C. while another favorable implantation temperature is near 500° C. Another favorable implantation temperature is at approximately 600° C. The implanted concentrations for a preferred doping material aluminum are approximately in the range between $10^{18}$ and $10^{21}$ cm$^{-3}$. A maximum implanted aluminum concentration is at approximately $1.5 \cdot 10^{21}$ cm$^{-3}$. Depending on the implantation energy and the implantation profile used, a buried, implanted region can form below the surface of the semiconductor layer.

A low aluminum concentration of $5 \cdot 10^{19}$ cm$^{-3}$ is achieved with a favorable implantation profile with the following implantation parameters:

$1.7 \cdot 10^{15}$ cm$^{-2}$ at 450 keV
$8 \cdot 10^{14}$ cm$^{-2}$ at 240 keV
$5 \cdot 10^{14}$ cm$^{-2}$ at 120 keV
$2.6 \cdot 10^{14}$ cm$^{-2}$ at 50 keV A high aluminum concentration of $1.5 \cdot 10^{21}$ cm$^{-3}$ is achieved with a favorable implantation profile with the following implantation parameters:

$5 \cdot 10^{16}$ cm$^{-2}$ at 450 keV
$2.4 \cdot 10^{16}$ cm$^{-2}$ at 240 keV
$1.5 \cdot 10^{16}$ cm$^{-2}$ at 120 keV
$8 \cdot 10^{15}$ cm$^{-2}$ at 50 keV Thus, a buried, implanted region is obtained which has a depth of approximately 100–600 mm below the SiC surface.

If this highly doped region of the component must be used later on in particular for the ohmic contact of electrodes or other structures in the semiconductor component, then the buried region must be exposed. Following the annealing, the region can be exposed with the aid of chemical or physical etching processes, e.g. dry etching (RIE). In a particularly favorable method, the material is removed during the annealing step. Providing the surface of the SiC layer with a masking prior to the implantation is useful, so that dopants are implanted only in the desired regions of the layer and no dopants are implanted in the regions that are covered by the masking. The masking can be either a suitable cover or a structured layer of oxide or metal, produced with standard and in particular photo-lithographic methods, which layer was previously deposited on the layer surface and is removed following implantation or the annealing. The masking for one favorable modification of the component according to the invention is provided as integral part of the semiconductor component, in particular as insulating layer, and remains on the SiC surface. The ion implantation can be carried out at room temperature or at a slightly increased temperature, in particular one between the room temperature and 1200° C., especially between the room temperature and 1000° C. The advantage of an increased implantation temperature is that the radiation defects can be annealed at least in part during the implantation already. In particular with SiC, the later activation of the dopants is favorably influenced. However, the heating temperature for the semiconductor, provided during the implantation, is clearly lower than the temperature required for annealing and activating the dopants.

Following the implantation, the silicon carbide material shows a discoloration in the implanted region, which can be traced back to defects in the crystal lattice. Among other things, the discoloration depends on the implanted dose and the implantation temperature. N-conducting SiC that is not annealed is blackened and non-transparent at n$^{++}$ doping, but is light green and transparent at n$^-$ doping. If the doping of the material is well compensated, so that the SiC is semi-insulating, the material becomes transparent again. With p-doped SiC that is not annealed, the material shows a bluish-gray coloration and is dull with p$^{++}$ doping while the material is gray-blue and transparent with non-annealed p$^-$-doping.

In accordance with the invention, the implanted component is irradiated with a light pulse following the implantation. A particularly favorable radiation source is a photoflash light with essentially white light, particularly noble gas high-pressure lamps or metal-vapor high-pressure lamps. Especially suitable is a xenon high-pressure lamp or an arrangement of several such lamps. The irradiation preferably occurs with a single pulse and lasts from of 1–100 ms, particularly preferred is a duration of 10 ms to 50 ms. A favorable output is above approximately 10 J/cm$^2$. One exemplary embodiment uses a xenon high-pressure photoflash lamp lasting approximately 20 ms and an integrated energy per pulse of approximately 100 J/cm$^2$. The energy density was estimated from melting tests for silicon and by taking into consideration the reflection factor for the incident light and the thickness of the silicon wafer used, which is approximately 250 μm.

It is particularly favorable if the light source can be scattered with suitable optical means in such a way that the total component area can be illuminated simultaneously. The light source can also consist of several lamps. With SiC, an energy density of approximately 100 J/cm$^2$ is extremely favorable. Given an array of several xenon high-pressure lamps, areas up to 4" diameter can be annealed with a single light pulse. Larger areas can be irradiated by combining several lamps, so that a critical energy density at each point in the radiation field, which impacts with an area to be irradiated, is above a critical limit for the energy density. For SiC, this limit is below 100 J/cm$^2$ according to the previously described detection method. The most favorable energy density in this case also depends on the temperature of the component during the irradiation, as well as the thickness of the layer to be irradiated itself and/or the depth of the semiconductor layer in the case of buried, doped layers. The irradiation parameters advantageously are adapted to these conditions. With strongly increased absorption of the radiation and/or with particularly energy-rich radiation, a pulse length of several picoseconds to milliseconds is favorable.

Besides the advantage of saving time when annealing the radiation damages according to the invention, it is also possible to dispense with an expensive arrangement for the lateral displacement of a light beam, used for the uniform scanning of a component surface, e.g. as required with a laser. Furthermore, irradiating every area of the surface with the same light intensity and energy is not easy if a light and/or laser beam is guided line-by-line over an area to be irradiated since no defined energy can be introduced by the scanning beam, particularly at the overlapping areas of irradiated lines. In particular this applies to irradiated materials, which suffer at higher temperatures a material loss through sublimation or evaporation of the constituents. It also avoids undesirable effects in the semiconductor, which can develop at the edges of the respectively illuminated, locally restricted areas in zones with decreasing light intensity and make it more difficult to anneal a semiconductor and activate the dopants.

For the irradiation, the component is preferably introduced into a protective atmosphere to avoid oxidation of the semiconductor material. Depending on the semiconductor material, a suitable protective gas atmosphere in particular consists of argon, nitrogen, hydrogen or forming gas. The atmosphere is advantageously selected such that the semiconductor is not contaminated in an undesirable way by the protective gas. The irradiation can be carried out at room temperature and the component is not purposely heated further. A particularly favorable embodiment calls for mounting the component on a cooling surface to protect the non-implanted regions of the component from the effects of heat during a local annealing.

The component for another favorable embodiment is heated up for the annealing to a relatively low temperature between the room temperature and 600° C. The maximum temperature in any case is considerably below the temperature of up to 2000°, normally used for the annealing. This is particularly advantageous if the component is irradiated with light immediately after the dopants are implanted and if the implantation is carried out at an increased temperature, in particular between 400° C. and 700° C. It is particularly favorable if the SiC is provided with a masking prior to implantation, meaning it is implanted in a structured manner. A particular advantage is that fact that no separate oven is required for the implantation, which is carried out at moderately increased temperatures, as well as for the annealing of the implanted component. If necessary, the irradiation can be carried out directly in the implantation chamber, wherein an optical coupling into the irradiation chamber must be provided, which is preferably flooded with a predetermined pressure prior to the annealing in a suitable atmosphere. A separate irradiation chamber is not required in that case, which results in a considerable saving in processing time and system costs.

Depending on the source and intensity of the light, the irradiation time can be adjusted to be between several seconds and picoseconds. In the process, several pulses can be used successively or longer pulses can be used for the irradiation. The parameters must be adapted to different semiconductor materials and dopants, as well as to the respective radiation source. For an advantageous reduction of the thermal stress on the component, the irradiation time should be as short as possible.

The electromagnetic radiation pulse can irradiate the complete surface of the SiC component. It is particularly advantageous if a light source with a spectrum is selected, which has an increased intensity in the wavelength range where the optical absorption of the semiconductor material is high, especially after the implantation. With SiC, the discoloration of the material after the implantation indicates an increased optical absorption because of the radiation damages. If no differences in the optical absorption of a disturbed and undisturbed semiconductor exist, it is advantageous if the desired regions are provided with a masking, so that only the semiconductor regions to be annealed are irradiated.

The implanted SiC region is again clear and transparent following irradiation with electromagnetic rays. Based on activation and movement measurements of the charge carriers, it must be concluded that the short-term irradiation in the implanted region of the SiC layer causes a short-term and locally effective temperature of up to 2000° C., even though the component itself was not heated up further or at most was kept at a considerably lower temperature below 1000° C., preferably near the implantation temperature.

FIG. 1 contains a comparison of electrical material parameters of silicon carbide treated according to the state of the technology and according to the invention with an aluminum doping for two concentrations of $5 \cdot 10^{19}$ cm$^{-3}$ and $1.5 \cdot 10^{21}$ cm$^3$. The hole concentration, specific resistance and hole movement as function of the temperature are respectively shown as material parameters. The annealing of the comparison component according to the state of the technology occurs during a ten-minute oven tempering in an argon atmosphere and at an annealing temperature of 1650° C.

The parameters for both types of annealing practically do not differ with a lower aluminum doping of $5 \cdot 10^{19}$ $^{cm-3}$. The charge carrier concentration (holes) for both methods is below the solubility limit of $1 \cdot 10^{20}$ cm$^{-3}$ at 1700° C. and increases with the temperature, in a manner known to the person skilled in the art. The treatment according to the invention, however, permits a considerable saving in processing time and expenditure as compared to a time-consuming and energy-consuming oven treatment. In addition, the thermal stress on the component is on the whole more gentle than during an oven treatment.

In contrast, the hole concentration and specific resistance with an extremely high doping of $1.5 \cdot 10^{21}$ cm$^{-3}$ are clearly superior when using the method according to the invention. The measured concentration of holes in the component treated according to the invention is higher by one order of magnitude. The specific resistance is lower by a factor of five than for the comparison sample subjected to oven treatment. With the optical radiation effect, the component temperature through oven heating was only at a heating temperature of approximately 600° C. In contrast to the comparison sample treated according to the state of the technology, the sample treated according to the invention shows a metallic behavior. In addition, the concentration of holes corresponds essentially to the maximum possible concentration at the solubility limit of 2000° C. Such an advantageously high concentration of holes cannot be achieved with standard oven treatments in the thermodynamic balance.

Figure 2B:
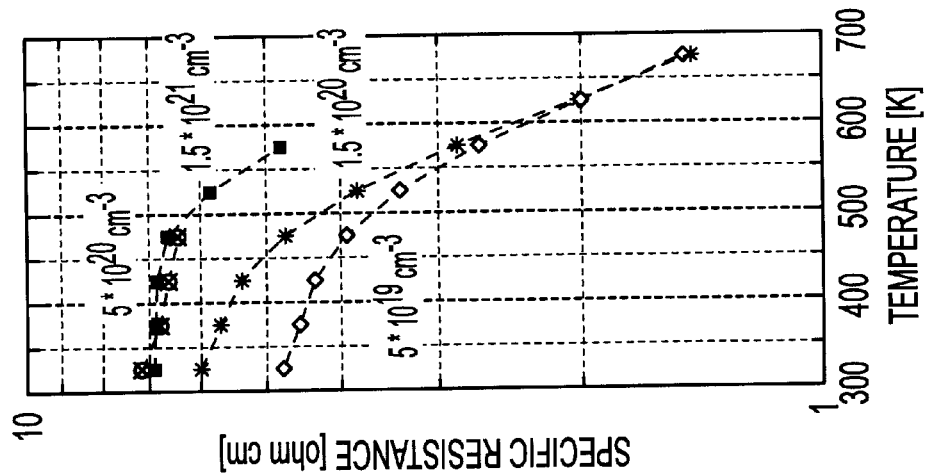
Figure 2C:
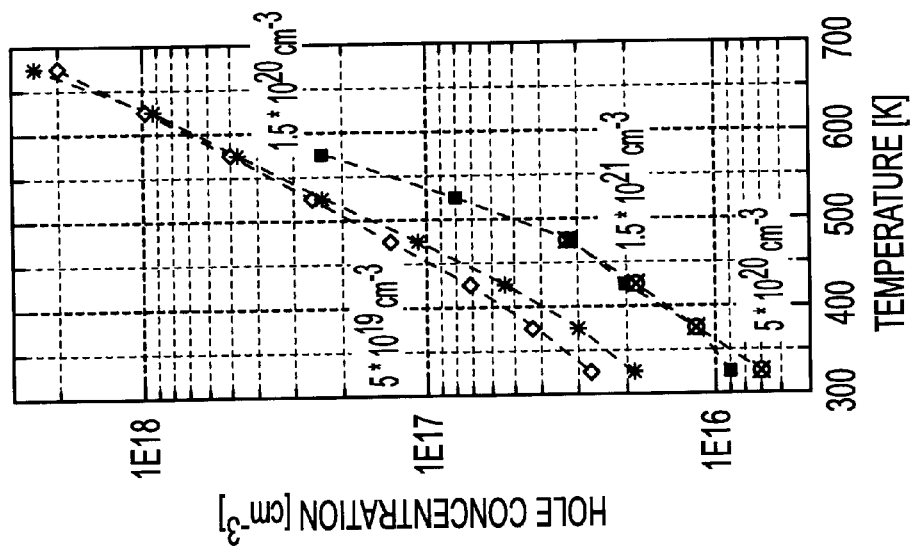

FIG. 2 shows the results of another type of doping in SiC. Boron was used as dopant in a comparable concentration and fluence as was used for aluminum in FIG. 1. As shown in the characteristic curves, there are no significant differences between the SiC material annealed according to the invention and the SiC material annealed with the standard oven treatment. The annealing according to the invention is at least equivalent to the known method with respect to annealing and activation of the dopants.

Further examinations of depth profiles of annealed SiC samples using secondary mass spectrometry show that in particular the aluminum concentration does not show any significant dislocations, either before or after the photoflash as well as following the oven treatment.

According to another preferred embodiment, the annealing of the implanted SiC layer is not carried out in a protective gas atmosphere, but in a vacuum. Since SiC suffers a silicon loss and/or carbon loss through sublimation at temperatures above 1200° C., which loss increases strongly with the increasing temperature, it is also possible to select a vacuum environment as atmosphere in which at least one increased partial pressure is adjusted for the volatile component of the semiconductor, particularly silicon or SiC with silicon carbide. Erosion of the SiC surface is avoided in this way. The component is advantageously placed into an SiC crucible and is optically irradiated.

Another preferred embodiment provides that during the irradiation of the implanted SiC region, the surface of the SiC layer is purposefully eroded at the same time and the previously buried, doped region is exposed. For this, the component is preferably introduced during the annealing step into a vacuum environment, the total pressure of which is preferably lower than $10^{-3}$ Pa. The SiC erosion through sublimation is temperature dependent and can be purposefully controlled through partial pressure and temperature. During the irradiation, the erosion rate can also be influenced and a defined erosion of the surface made possible by varying the wavelength and the pulse duration of the electromagnetic irradiation. As a result, a targeted exposure of the buried, doped region is possible. The special advantage is that the annealing and exposure of the doped, buried region is possible in a single process step. The SiC layers, which were irradiated with a Xe high-pressure lamp pulse of 20 ms duration in an argon atmosphere typically show a surface erosion of approximately 100 nm.

What is claimed is:

1. A method for producing a microelectronic semiconductor component, comprising: introducing the semiconductor component into a radiation chamber; heating the semiconductor component within the chamber to a first desired temperature while maintaining the semiconductor component at the first temperature; producing doped regions in the semiconductor component through ion implantation; thereafter annealing the semiconductor component to remove irradiation damage by subjecting the semiconductor component at a second, desired heating temperature to electromagnetic optical radiation; and, subsequently removing the semiconductor component from the radiation chamber; and wherein an upper heating temperature of 1200° C. is not exceeded in the radiation chamber.

2. A method according to claim 1, wherein the semiconductor component is irradiated with rays from at least one or several gas high-pressure lamps and vapor high-pressure lamps.

3. A method according to claim 1, wherein the semiconductor component is irradiated with an optical pulse with a duration in the range of 1 ms to 100 ms (milliseconds).

4. A method according to claim 1, wherein a desired thickness of a surface layer in the irradiated region is eroded as a result of the effect of electromagnetic radiation on the semiconductor component.

5. A method according to claim 1, wherein a mixed crystal semiconductor material is used for the component.

6. A method according to claim 1, wherein silicon carbide is used as the semiconductor material.

7. A method according to claim 1, wherein silicon is used as the semiconductor material.

8. A method according to claim 1, wherein an upper heating temperature of 800° C. is not exceeded.

9. A method according to claim 1, wherein the semiconductor component is provided with a removable masking layer prior to the implantation or the optical irradiation.

10. A method according to claim 1, wherein the semiconductor component is provided with a fixed masking layer prior to the implantation or the optical irradiation.

11. A method according to claim 1, wherein the semiconductor component is irradiated at a pressure below atmosphere pressure.

12. A method according to claim 1, wherein the irradiation with optical rays occurs in a protective gas atmosphere.

13. A method according to claim 1, wherein: essentially the complete surface of the semiconductor component is irradiated with optical rays and is heated at least in the doped region; and each location on the surface, which is subjected to radiation, is irradiated at the same time.

14. A method according to claim 1, wherein the semiconductor component is irradiated in an atmosphere in which at least an increased partial pressure is adjusted for one or more volatile components of the semiconductor, relative to the environmental conditions.

* * * * *